(12) United States Patent
Wendling et al.

(10) Patent No.: US 9,747,738 B1
(45) Date of Patent: Aug. 29, 2017

(54) ELECTRONIC ACCESS CONTROL DEVICE

(71) Applicants: Jean Hugues Wendling, Denver, CO (US); Michael T Conlin, Superior, CO (US); Daniel William Field, Broomfield, CO (US); Michael William Malone, Boulder, CO (US); Taylor Schmidt, Littleton, CO (US)

(72) Inventors: Jean Hugues Wendling, Denver, CO (US); Michael T Conlin, Superior, CO (US); Daniel William Field, Broomfield, CO (US); Michael William Malone, Boulder, CO (US); Taylor Schmidt, Littleton, CO (US)

( * ) Notice: Subject to any disclaimer, the term of this patent is extended or adjusted under 35 U.S.C. 154(b) by 0 days.

(21) Appl. No.: 15/215,665

(22) Filed: Jul. 21, 2016

(51) Int. Cl.
*G07C 9/00* (2006.01)
*H05K 9/00* (2006.01)
*H05K 5/02* (2006.01)
*G06K 7/00* (2006.01)

(52) U.S. Cl.
CPC ....... *G07C 9/00309* (2013.01); *G06K 7/0013* (2013.01); *G06K 7/0056* (2013.01); *G07C 9/00119* (2013.01); *H05K 5/0204* (2013.01); *H05K 5/0247* (2013.01); *H05K 9/002* (2013.01); *H05K 9/0086* (2013.01); *H05K 9/0088* (2013.01)

(58) Field of Classification Search
CPC ...... G07C 9/00309; G07C 2009/00793; G07C 9/00571; G07C 2209/04; G07C 9/00111; G07C 9/00182; G07C 9/00817
USPC ....................................................... 340/5.65
See application file for complete search history.

(56) References Cited

U.S. PATENT DOCUMENTS

| | | | | |
|---|---|---|---|---|
| 6,798,341 | B1 * | 9/2004 | Eckel ..................... | G01K 1/045 340/12.32 |
| 7,042,365 | B1 * | 5/2006 | Diaz-Lopez ........... | G08B 21/10 340/521 |
| 7,336,483 | B2 * | 2/2008 | Wang .................... | G11B 33/025 345/169 |
| 9,269,241 | B2 * | 2/2016 | Chiang .................. | G01R 31/04 |

* cited by examiner

*Primary Examiner* — Mark Blouin
(74) *Attorney, Agent, or Firm* — Daniel M. Cohn; Howard M. Cohn (57) ABSTRACT

Embodiments of the present invention provide an improved access control unit with an asymmetric transmission pattern. A shielded backplate reduces the interior transmission pattern. The secure side transmission pattern is much smaller than the unsecure side transmission pattern, such that a credential located within the secure side area of a building is not likely to trigger the access control unit, thus reducing the risk of an unauthorized access.

20 Claims, 9 Drawing Sheets

ELECTRONIC ACCESS CONTROL DEVICE

FIELD OF THE INVENTION

The present invention relates generally to building security, and more particularly, to a door access control unit.

BACKGROUND

Physical Access Control systems have historically included access control "readers" mounted at or near the entrance doors of commercial facilities. When a user nears the door, they present a badge to the reader typically mounted near the door. Legacy access control readers and credentials have historically worked using the principle of mutual inductive coupling between the DC powered reader and a credential without an internal power source. In other words, the reader produces an AC magnetic field at the carrier frequency that is present in the "proximity" of the reader antenna. When the credential is brought into the field such that it is inductively coupled to the reader, the credential harvests power from the field and uses that power to run the electronics in the credential. The credential may be in the form of a card, identification badge, or fob. This allows users to enter an area without the need for a physical key. Additionally, access privileges for a user can be added or revoked by an administrator, without impacting other users. Thus, physical access control systems are an important aspect of security for businesses, residences, airports, hospitals, and many other venues. Therefore, it is desirable to have improvements in physical access control systems.

SUMMARY

Disclosed embodiments provide an electronic access control device comprising: a housing; an electronics module disposed within the housing; a shielded backplate mounted on the housing and configured and disposed to contain the electronics module within the housing; and a mounting plate configured and disposed to attach to a building surface and also to attach to the shielded backplate, and wherein: the mounting plate comprises a plurality of engagement tabs configured and disposed to engage with a plurality of tab ports formed within the shielded backplate, and wherein the shielded backplate comprises an electronics access opening formed within it, and wherein the mounting plate comprises a protruding tab with a hole formed therein, and wherein the shielded backplate comprises a protruding tab with a threaded hole formed therein, wherein the threaded hole of the protruding tab of the shielded backplate is configured and disposed to align with the hole of the protruding tab of the mounting plate.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

DETAILED DESCRIPTION

Due to the inductive coupling requirement, the readers historically used to control access to a door have been limited to communication distances of less than 1 foot. This communication range limitation places the requirement on the user that they must present the credential to the reader. This presentation must in general require the reader and credential antennas to be coaxial and within 1 foot of each other. In most cases, this communication range is restricted to be less than 6 inches.

Modern access control readers include the ability to work with active UHF credential technologies such as Bluetooth. Since this technology has its own power source such as a battery the credential does not derive its power source from the reader field and therefore is capable of starting the authentication and identification extraction process.

Since the UHF communication mechanism is far field radiation, it is possible at UHF frequencies to establish communication ranges on the order of 50 feet or more depending on the details of the transmitter and receiver designs. This increased communication range can be desirable in certain circumstances. For example, a user who approaches a door and is carrying an active UHF credential in their pocket might desire the door to unlock at a distance of several feet without the requirement of removing the credential from their pocket and "presenting" it to the reader device as described. This provides an improved level of convenience for users. However, problems can arise when the reader antenna produces an omnidirectional transmission/radiation pattern that propagates on both the unsecured side as well as the secure side of the door. The presence of the reader's propagated field inside the building or on the secure side of the door presents a problem for the designer of the system. The problem is that users with active UHF credentials already on the secure side of the door or in the building might be read by the reader mounted on the unsecure side of the door. In this case, the door might be unlocked by the valid credential already in the building resulting in access granted to unauthorized individuals at or near the unsecure side of the door.

Embodiments of the present invention address this issue by providing various configurations offering asymmetric shielding so that a user on the secure side of the door does not cause the door to be unlocked. Thus, embodiments of the present invention reduce the risk of a security breech due to unintended credential activation. In embodiments of the present invention, the credential may include, but is not limited to, a mobile device such as a phone, a card, a key-fob or other wearable device such as a smart watch, bracelet, or other suitable device.

Figure 1:
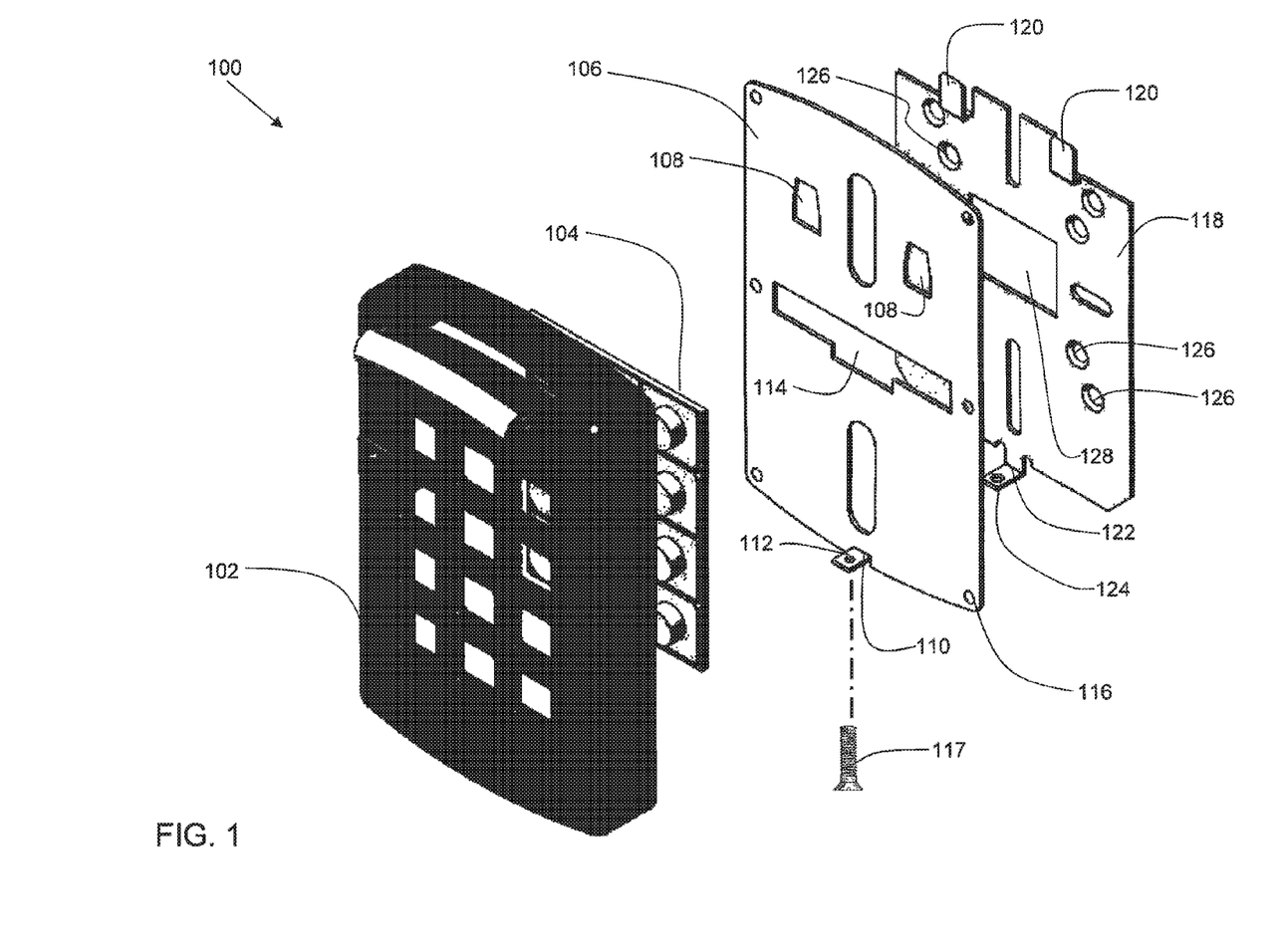
FIG. 1 is an exploded view of an embodiment of the present invention.

FIG. 1 is an exploded view of an embodiment of the present invention. Electronic access control unit 100 comprises a housing 102. An electronics module 104 is configured and disposed to fit within the housing 102. A shielded backplate 106 is disposed to attach to the housing 102, thereby enclosing the electronics module 104, and thus, serving to contain the electronics module 104 within the housing 102. A plurality of screw holes 116 are disposed around the perimeter of the shielded backplate 106 and receive screws or other fasteners (not shown) that attach to the housing 102, thus securing the shielded backplate 106 to the housing 102. A mounting plate 118 is configured and disposed to attach to a building surface and also to attach to the shielded backplate 106.

The shielded backplate 106 comprises a plurality of tab ports 108, which are openings within the shielded backplate that are configured to receive engagement tabs 120 that are attached to the mounting plate 118. Additionally, the shielded backplate 106 comprises an electronics access opening 114 formed within it. Cabling delivering power and/or signaling may traverse the electronics access opening when the access control unit is installed.

The mounting plate 118 comprises multiple mounting holes 126 for securing the mounting plate to a building surface such as a wall or ceiling. The mounting plate also has an opening 128 to allow cabling (not shown) to reach the electronics module 104. Mounting plate 118 further comprises a protruding tab 122 with a hole 124 formed therein. Hole 124 is configured and disposed to align with threaded hole 112 of protruding tab 110 of shielded backplate 106, such that screw 117 traverses hole 124 of protruding tab 122, and engages with threaded hole 112 of protruding tab 110, thereby securing the shielded backplate 106 to the mounting plate 118. In some embodiments, screw 117 may be tamper-resistant screw such as Torx, Security Torx, double-square, triple-square, pentalobe, or other uncommon screw type may be used to provide a degree of tamper-resistance.

Note that while the access control unit 100 shown in FIG. 1 shows a housing and electronics module including a keypad, other embodiments may provide an access control unit that has no keypad. In other embodiments, the access control unit may include an antenna, with no user interface. In yet other embodiments, the access control unit may include a touch screen.

Figure 2:
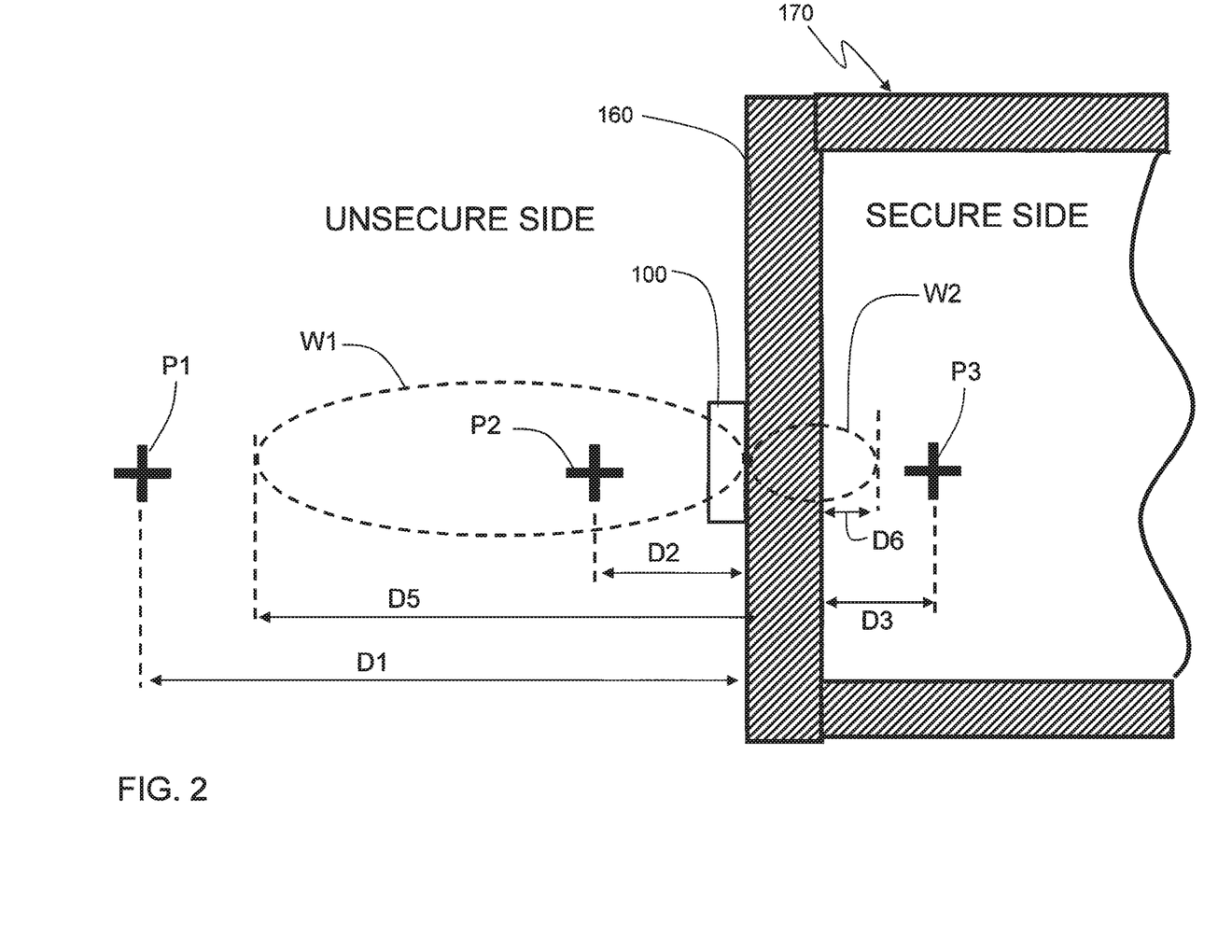
FIG. 2 is a side view illustrating use of an embodiment of the present invention in a wall mount configuration.

FIG. 2 is a side view illustrating use of an embodiment of the present invention in a wall mount configuration. As shown in FIG. 2, access control unit 100 is mounted to an exterior wall 160 of a building 170. Using a longer range UHF transmitter, a transmission pattern W1 may extend several feet away from the building. As illustrated, person with a corresponding credential unit (such as a fob) located at position P1, a distance D1 from the building, is too far to activate the access control unit 100. A person with a credential unit located at position P2, a distance D2 from the building, is within range, and is able to activate the access control unit to allow a door to be unlocked, thus allowing entry into the building 170. Once inside the building, it is desirable that the person's credential unit will not falsely unlock the door, which could result in a security breech. The shielded backplate of access control unit 100 restricts the transmission pattern W2 such that it does not extend very far into the building, such that a person with a credential unit located at position P3, a distance D3 from the exterior wall 160 of the building, does not activate the access control unit. Hence, the access control unit 100 has an asymmetrical transmission pattern. Transmission pattern W1 extends a distance D5 outside of the building 170, while transmission pattern W2 extends a distance D6 inside of the building. In embodiments D5 is unequal to D6. In embodiments, distance D5 may range from about 2 feet to about 6 feet, and distance D6 may range from about 6 inches to about 18 inches. Additionally, D1>D5>D2, and D3>D6. Thus, when a user walks into the building 170, they quickly go out of range of the access control unit, thereby preventing an unauthorized access. If the transmission pattern W2 were longer, then a person located inside the building could unknowingly allow the access control unit 100 to be triggered, unlocking the door. Due to the shielded backplate 106 (FIG. 1), the secure side transmission pattern W2 is considerably shorter than the transmission pattern W1 on the unsecure side, and the chance of a security breech is greatly reduced.

Figure 3:
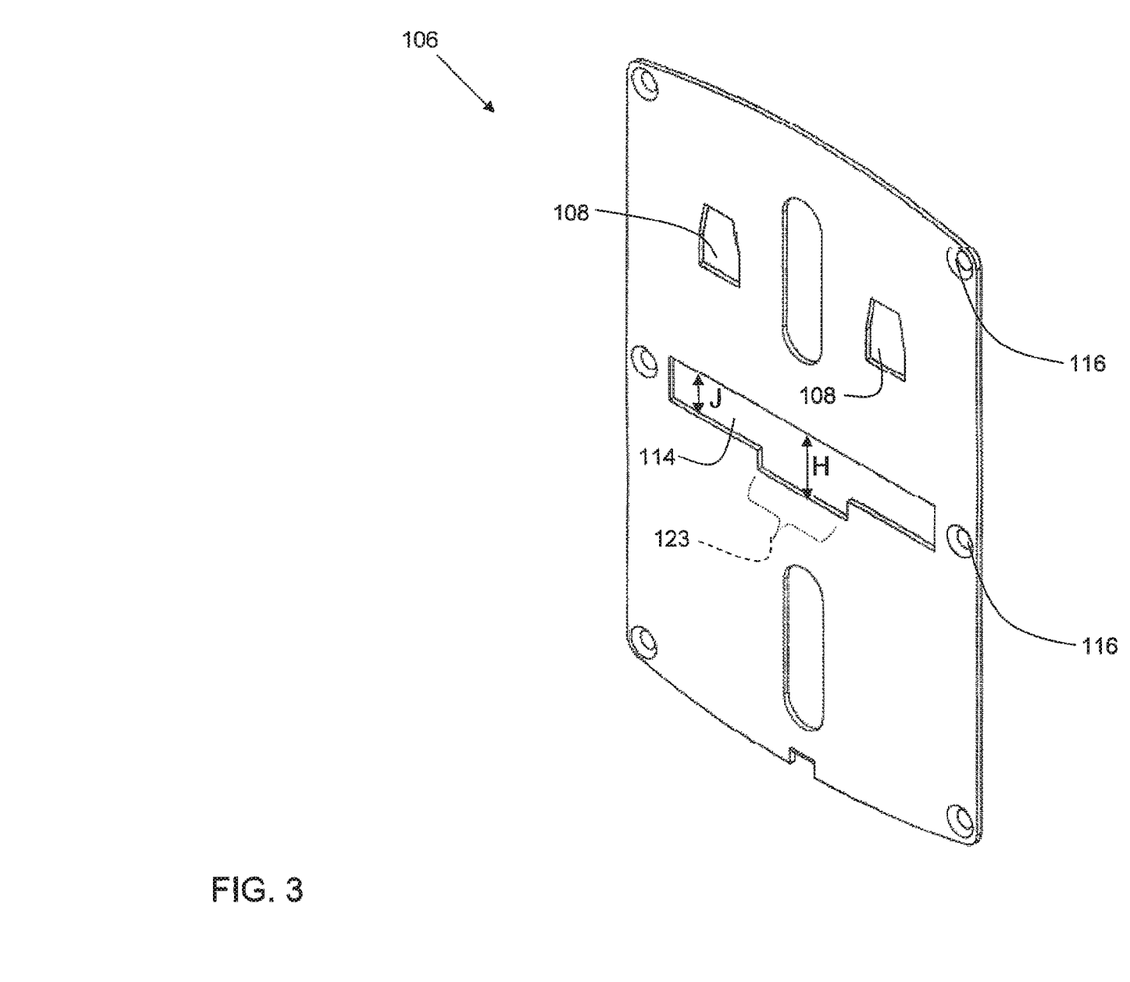
FIG. 3 is a shielded backplate in accordance with embodiments of the present invention.

FIG. 3 is a shielded backplate 106 in accordance with embodiments of the present invention. A plurality of tab ports 108 are shown. While two tab ports are shown in FIG. 3, embodiments may have more or fewer tab ports. A plurality of screw holes 116 are disposed around the perimeter of the shielded backplate 106 and receive screws or other fasteners (not shown) that attach to the housing 102. The electronics access opening 114 is shown T-shaped, and comprises a first height region and a second height region 123, wherein the second height H is larger than the first height J, and wherein the second height region 123 is disposed at a midpoint of the electronics access opening 114. In some embodiments, the electronics access opening 114 has a maximum height H ranging from about 0.2 inches to about 0.5 inches. This is an important value, as it is less than the wavelength of many frequencies used in access control units, thus providing effective shielding. For example, a wavelength at 2.4 GHz is 4.92 inches, so the electronics access opening 114 is sized to be a fraction of the wavelength, which is sufficient to stop a majority of energy at that wavelength. Hence, for radios such as Bluetooth® and Bluetooth Low Energy (BLE) that utilize frequencies in this range, embodiments provide effective shielding, thus creating an asymmetric transmission/reception pattern for the access control unit. In embodiments, the shielded backplate may be comprised of aluminum, steel, or other suitable material that provides electromagnetic shielding.

Figure 4:
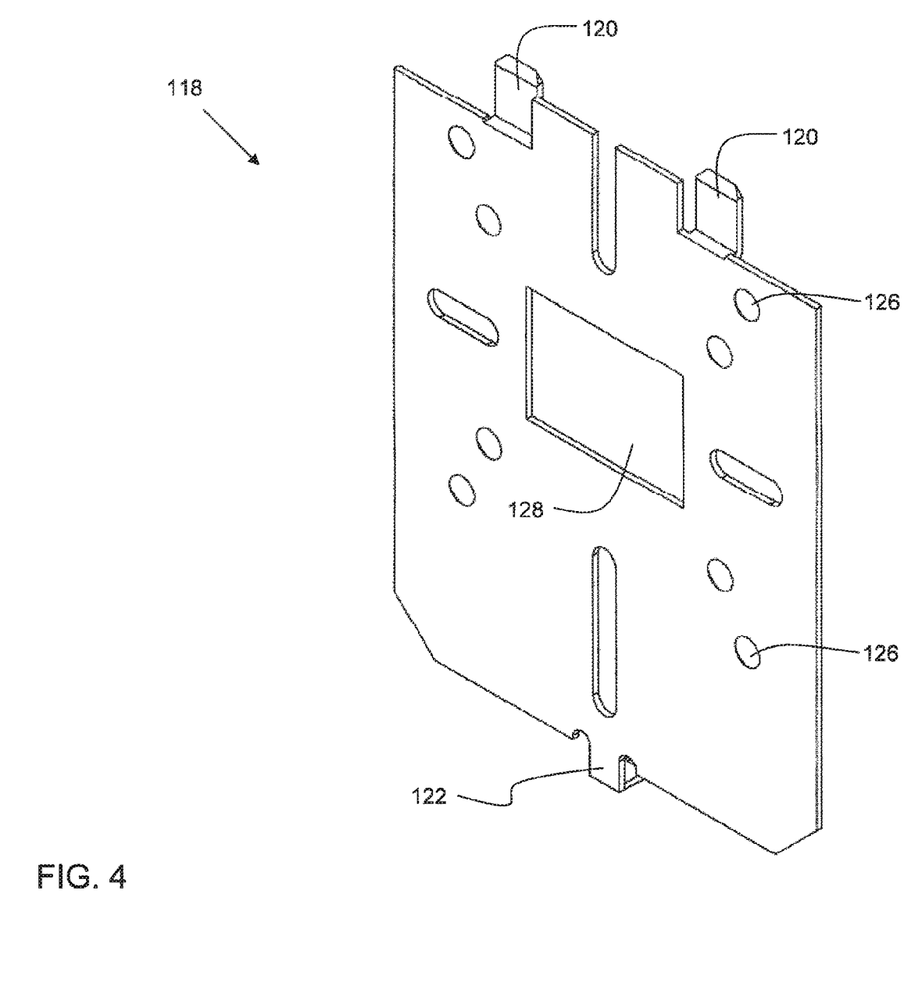
FIG. 4 is a mounting plate in accordance with embodiments of the present invention.

FIG. 4 is a mounting plate 118 in accordance with embodiments of the present invention, showing the side that is in contact with the building exterior surface. The mounting plate has an opening 128 to allow cabling (not shown) to reach the electronics module 104. The mounting plate 118 also comprises multiple mounting holes 126 for securing the mounting plate to a building surface such as a wall or ceiling. Engagement tabs 120 are attached to the mounting plate 118. Protruding tab 122 is located at the base of the mounting plate 118. The engagement tabs 120 and protruding tab 122 serve to attach the access control unit to an exterior surface of a building such as a wall or ceiling. In embodiments, the mounting plate 118 is comprised of steel. In other embodiments, the mounting plate 118 is comprised of aluminum.

Figure 5:
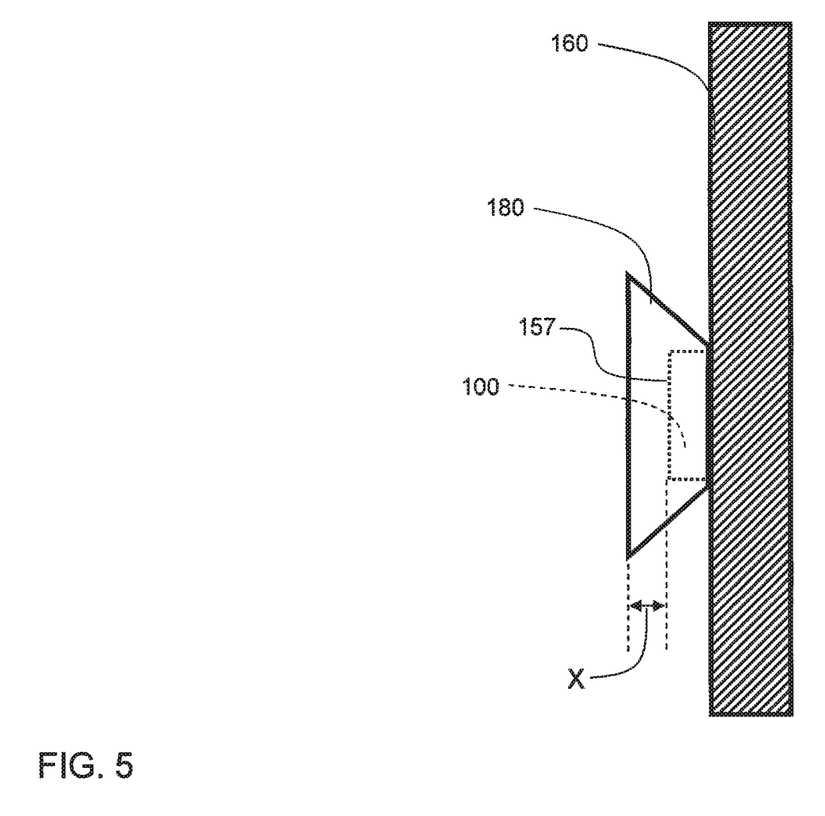
FIG. 5 is an alternative embodiment of the present invention including a shroud.

FIG. 5 is an alternative embodiment of the present invention including a shroud. An access control module 100 is mounted to an exterior wall 160 of a building. A shroud 180 is installed over the access control module 100. The shroud 180 is comprised of a material that has good electromagnetic energy shielding properties. The shroud allows for further constraining of the exterior transmission pattern. In embodiments, the shroud 180 extends a distance X beyond a front surface 157 of the access control unit 100. In some embodiments, the distance X may range from about 1 inch to about 3 inches.

Figure 6:
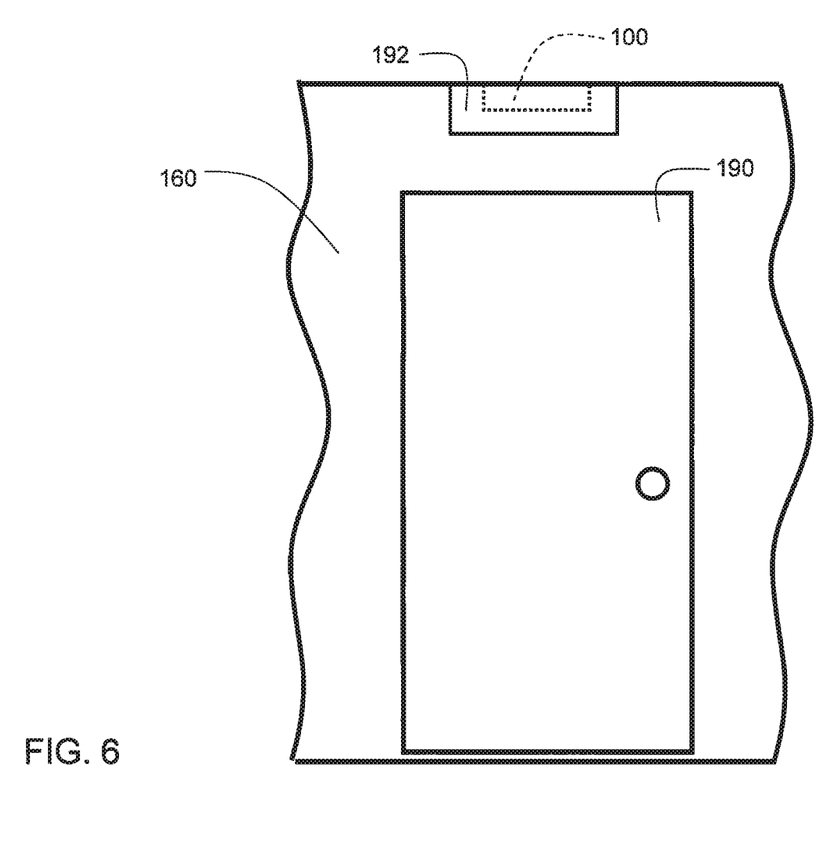
FIG. 6 shows a front view of an embodiment of the present invention in an above-door configuration.

FIG. 6 shows a front view of an embodiment of the present invention in an above-door configuration. In this embodiment, the access control unit 100 is mounted on wall 160 above a door 190. A shroud 192 provides additional constraints on the transmission/radiation pattern of the access control unit to create a more asymmetrical pattern regarding exterior and interior transmission/radiation.

Figure 7:
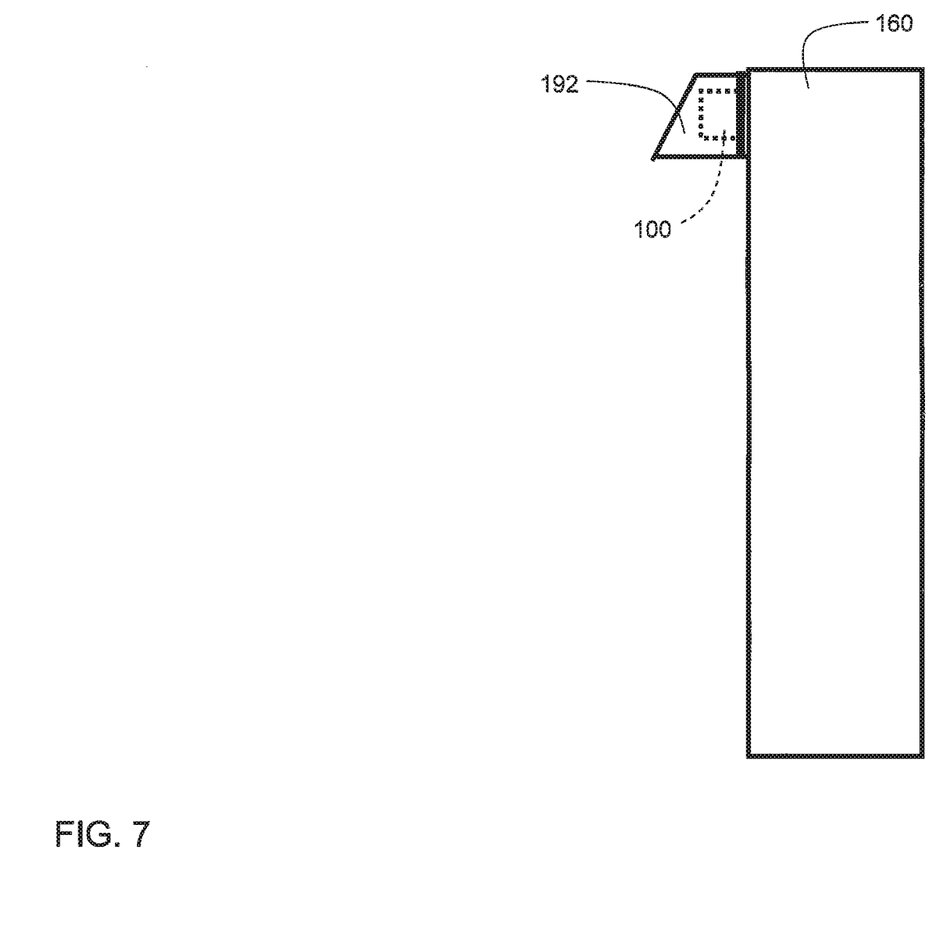
FIG. 7 shows a side view of an embodiment of the present invention in an above-door configuration.

FIG. 7 shows a side view of an embodiment of the present invention in an above-door configuration. The access control unit 100 is mounted on wall 160 on the exterior of a building. The shroud 192 covers the access control unit 100, further constraining its radiation pattern.

Figure 8:
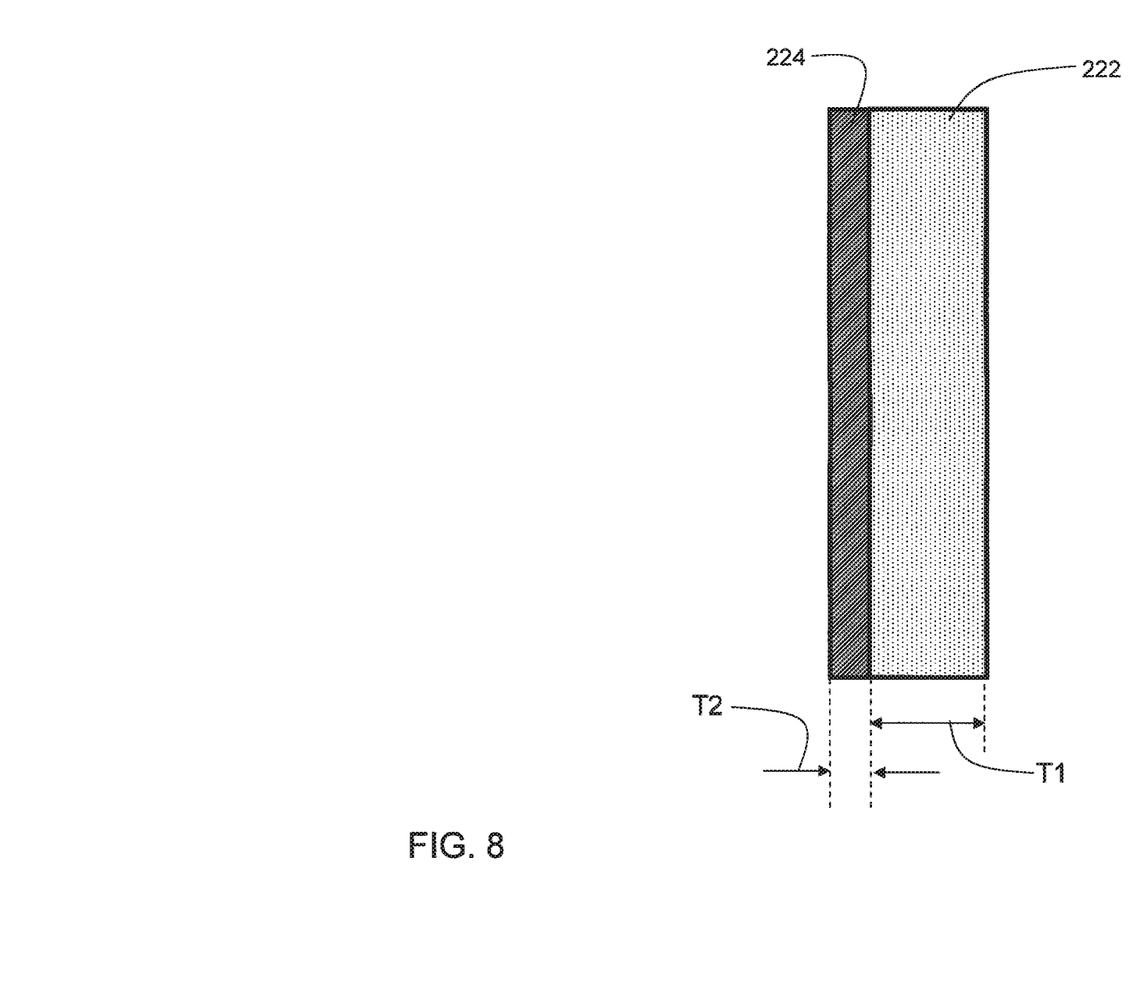
FIG. 8 shows details of a multilayer embodiment.

FIG. 8 shows details of a multilayer embodiment. In embodiments, the shielded backplate (106 of FIG. 3) may be comprised of multiple layers. In some embodiments, the shielded backplate is comprised of a first layer 222 having a thickness T1, and a second layer 224 having a thickness T2. The first layer 222 of material is disposed adjacent to the second layer 224 of material. The first layer 222 and the second layer 224 may be comprised of different materials. In embodiments, the shielded backplate may be comprised of a first layer 222 and a second layer 224, and oriented such that when the access control unit is assembled, the second layer is facing the electronics module (104 of FIG. 1). In embodiments, the first layer 222 may range in thickness from about 0.25 inches to about 0.5 inches, and the second layer 224 may have a thickness ranging from about 0.005 inches to about 0.01 inches. In some embodiments, second layer 224 may be comprised of copper. The copper may be in the form of a foil. Thus, in some embodiments, the first layer 222 may be comprised of aluminum or steel, and the second layer 224 may be comprised of copper foil. In other embodiments, the second layer 224 may be comprised of a copper-nickel coated conductive polyester fabric. In some embodiments, the second layer is comprised of CN-4190 fabric tape from 3M Corporation.

The shrouds disclosed in FIGS. 5-7 may also be constructed in a multilayer manner, using layers and thicknesses as described herein. Thus, in some embodiments, shroud 180 (FIG. 5) and shroud 192 (FIG. 6 and FIG. 7) may be comprised of a first layer 222 having a thickness T1, and a second layer 224 having a thickness T2. In embodiments, the first layer 222 may range in thickness from about 0.25 inches to about 0.5 inches, and the second layer 224 may have a thickness ranging from about 0.005 inches to about 0.01 inches. In some embodiments, second layer 224 may be comprised of copper. The copper may be in the form of a foil. Thus, in some embodiments, the first layer 222 may be comprised of aluminum or steel, and the second layer 224 may be comprised of copper foil.

Figure 9:
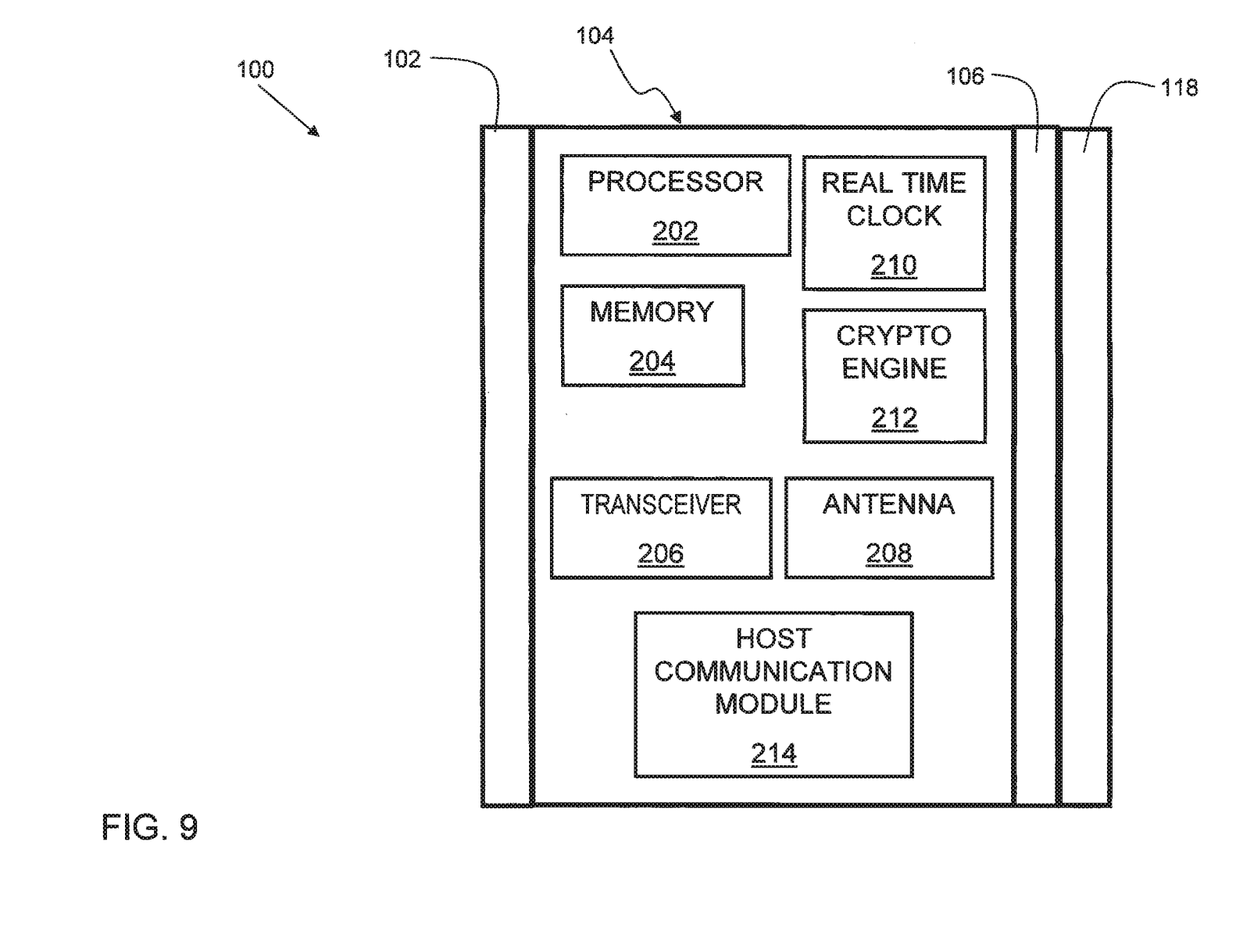
FIG. 9 is a block diagram of an embodiment of the present invention.

FIG. 9 is a block diagram of an access control unit 100 in accordance with embodiments of the present invention. The housing 102 encloses electronics module 104. Electronics module 104 includes a processor 202. The processor 202 is coupled to memory 204. Memory 204 may be non-transitory, and may include memory such as Flash, SRAM, ROM, or other suitable memory. The memory contains instructions, that when executed by the processor 202, communicate with transceiver 206, which is coupled to antenna 208, to operate the access control unit 100. In embodiments, transceiver 206 is a UHF transceiver. Thus, the memory contains instructions, that when executed by the processor, detect a received signal strength indication from a credential device, and grant access to an entryway in response to detecting a received signal strength indication that exceeds a predetermined threshold. The predetermined threshold may be selected such that once a user is more than 1 foot inside the secure side of an entryway, the received signal strength is insufficient to activate the access control unit. Due to the asymmetric nature of the access control unit of embodiments of the present invention, on the unsecure side, the credential can activate the access control unit at a greater distance (e.g. 6 feet). Thus, embodiments of the present invention provide convenience of easy access for credential holders, while improving security by reducing the risk of unauthorized access.

The access control unit may further include a real time clock 210 and a host communication module 214. The host communication module 214 may include an additional processor and/or peripherals used for communication with credential devices. The real time clock 210 may be used to limit access to a credential holder to particular times of day. For example, a credential holder who works a shift between 10:00 pm-6:00 am may only be allowed access from a time of day starting at 30 minutes prior to the start of their shift to 30 minutes after the end of their shift. The real time clock 210 serves to provide time-of-day information to processor 202, such that the access control unit can deny access based on time of day. In embodiments, the access control unit may be mounted in an electronic lock on a door. In embodiments, the credential may communicate with the access control unit. In some embodiments, the communication between the credential and access control unit may be bi-directional. In embodiments, the communication between the host and access control unit as well as between the access control unit and the credential may be cryptographically secured. In embodiments, a crypto engine 212 may be used to cipher, encrypt, decipher and/or decrypt communication between the credential and access control unit. In embodiments, the communication between the host and access control unit as well as between the access control unit and the credential may be cryptographically secured. In embodiments, the memory 204 contains instructions, that when executed by the processor 202 allow communication between the host and credential using ISO 7816 application protocol data units (APDU). In some embodiments, the memory 204 contains instructions, that when executed by the processor 202, enable communication between the access control unit and the credential using ISO 7816 application protocol data units (APDU).

As can now be appreciated, embodiments of the present invention provide an improved access control unit with an asymmetric transmission pattern. The secure side transmission pattern is much smaller than the unsecure side transmission pattern, such that a credential located within the secure area of a building is not likely to trigger the access control unit, thus reducing the risk of an unauthorized access.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. An electronic access control device comprising:
a housing;
an electronics module disposed within the housing;
a shielded backplate mounted on the housing and configured and disposed to contain the electronics module within the housing; and
a mounting plate configured and disposed to attach to a building surface and also to attach to the shielded backplate, and wherein:
the mounting plate comprises a plurality of engagement tabs configured and disposed to engage with a plurality of tab ports formed within the shielded backplate, and wherein the shielded backplate comprises an electronics access opening formed within it, and wherein the mounting plate comprises a protruding tab with a hole formed therein, and wherein the shielded backplate comprises a protruding tab with a threaded hole formed therein, wherein the threaded hole of the protruding tab of the shielded backplate is configured and disposed to align with the hole of the protruding tab of the mounting plate.

2. The electronic access control device of claim 1, wherein the electronics access opening has a maximum height ranging from about 0.2 inches to about 0.5 inches.

3. The electronic access control device of claim 1, wherein the shielded backplate is comprised of aluminum.

4. The electronic access control device of claim 1, wherein the shielded backplate is comprised of steel.

5. The electronic access control device of claim 1, wherein the shielded backplate is comprised of copper.

6. The electronic access control device of claim 1, wherein the shielded backplate is comprised of a first layer of material disposed adjacent to a second layer of material.

7. The electronic access control device of claim 6, wherein the first layer is comprised of aluminum and the second layer is comprised of copper.

8. The electronic access control device of claim 7, wherein the first layer has a thickness ranging from about 0.01 inches to about 0.25 inches, and wherein the second layer has a thickness ranging from about 0.01 inches to about 0.25 inches.

9. The electronic access control device of claim 1, wherein the electronics module comprises:
a processor;
a non-transitory memory coupled to the processor;
a transceiver; and
an antenna;
wherein the memory contains instructions, that when executed by the processor, detect a received signal strength indication from a credential device, and grant access to an entryway in response to detecting a received signal strength indication that exceeds a predetermined threshold.

10. The electronic access control device of claim 9, wherein the memory contains instructions, that when executed by the processor, perform the steps of:
communicating with the credential device via an ISO-7816 application protocol data unit;
receiving ISO-7816 application protocol data unit commands from a host communication module;
sending the ISO-7816 application protocol data unit commands to the credential device;
receiving a response to said commands from the credential device; and
communicating the response to the host communication module.

11. The electronic access control device of claim 9, wherein the transceiver is a Bluetooth Low Energy transceiver.

12. The electronic access control device of claim 1, further comprising a shroud disposed around the housing.

13. The electronic access control device of claim 12, wherein the shroud is comprised of aluminum.

14. The electronic access control device of claim 12, wherein the shroud is comprised of copper.

15. The electronic access control device of claim 12, wherein the shroud is comprised of a first layer of material disposed adjacent to a second layer of material.

16. The electronic access control device of claim 15, wherein the first layer is comprised of aluminum and the second layer is comprised of copper.

17. The electronic access control device of claim 16, wherein the first layer has a thickness ranging from about 0.25 inches to about 0.5 inches, and wherein the second layer has a thickness ranging from about 0.02 inches to about 0.05 inches.

18. The electronic access control device of claim 1, wherein the electronics access opening is T-shaped, and comprises a first height region and a second height region, wherein the second height region has a greater height than the a height of the first height region, and wherein the second height region is disposed at a midpoint of the electronics access opening.

19. The electronic access control device of claim 12, wherein the shroud extends beyond a front surface of the housing.

20. The electronic access control device of claim 19, wherein the shroud extends about one inch beyond the front surface of the housing.

* * * * *